United States Patent [19]

McDevitt et al.

[11] Patent Number: 4,583,287

[45] Date of Patent: Apr. 22, 1986

[54] COMBINATION INSERTION-EXTRACTION TOOL FOR INTEGRATED CIRCUITS

[75] Inventors: John E. McDevitt, Cumberland, R.I.; Ronald E. Senor, North Attleboro, Mass.

[73] Assignee: Augat Inc., Mansfield, Mass.

[21] Appl. No.: 754,530

[22] Filed: Jul. 12, 1985

[51] Int. Cl.⁴ ............................................ H05K 13/04
[52] U.S. Cl. ....................................... 29/741; 29/758; 29/764; 29/278
[58] Field of Search ................... 29/278, 758, 764, 741

[56] References Cited

U.S. PATENT DOCUMENTS

| | | | |
|---|---|---|---|
| 3,699,629 | 10/1972 | Hood et al. | 29/278 |
| 3,896,533 | 7/1975 | Ullman et al. | 29/741 |
| 4,521,959 | 6/1985 | Sprenkle | 29/741 |

Primary Examiner—Robert C. Watson

Attorney, Agent, or Firm—Weingarten, Schurgin, Gagnebin & Hayes

[57] ABSTRACT

A dual function tool for inserting and extracting integrated circuits and other circuits and composites of dual-in-line or quad configurations respectively into and from circuit boards is disclosed. It possesses vertically adjustable opposing side plates having spaced inwardly-pointing tines at their lower ends for grasping an integrated circuit, and also possesses a mechanism for raising and lowering these plates, and a push block and associated mechanism for simultaneously releasing an integrated circuit and forcing it into a circuit board socket by uniform application of pressure. As the integrated circuit is removed from or inserted into a circuit board by a uniform application of force with no bending or twisting, the chance of bending or breaking integrated circuit leads or pins or breaking the often fragile body is minimized.

15 Claims, 12 Drawing Figures

COMBINATION INSERTION-EXTRACTION TOOL FOR INTEGRATED CIRCUITS

FIELD OF THE INVENTION

This invention relates to tools for handling integrated circuit components, and more particularly, concerns a dual-function tool for inserting and extracting integrated circuits or other electrical components respectively into and from circuit boards.

BACKGROUND OF THE INVENTION

In the process of inserting integrated circuits and other circuits and components of dual-in-line or quad configurations into appropriate sockets on circuit boards, or removing them, it is frequently difficult to prevent the bending or breaking of contact pins, or the breaking of fragile units by inadvertent application of uneven pressure. The problem is particularly acute where insertion or removal operations are attempted by hand. To overcome such difficulties various tools have been devised for these tasks. Most of these tools are operative for only one or the other of these operations, requiring the technician to have a variety of insertion and removal tools at hand, which in turn entails unnecessary expense and the possibility of inefficiency to the extent that the wrong tool is picked up. It is therefore desirable to have a simple and efficient tool which is capable of inserting and extracting integrated circuits respectively into and from circuit boards, as desired.

SUMMARY OF THE INVENTION

The above need is met in the present invention, which is a simple and effective tool for inserting and extracting circuits respectively into and from circuit boards. The frame of the tool is a bracket having an inverted U shape with the sides of the U constituting bracket legs which support the tool on a circuit board, the part connecting the bracket legs constituting the top of the bracket.

A first block is slideably mounted between the bracket legs so that it is adjustable in the vertical direction. This first block is adapted for attachment to and mating with a corresponding shaft, movement of which controls the vertical adjustment of the block.

Attached to this first block between the block and the bracket legs are side plates which terminate at their lower ends in a number of spaced fingers or tines which point away from the adjacent bracket legs and toward the corresponding tines on the opposing side plate. Each of these plates has at least one indentation in the side facing the bracket legs, these indentations creating corresponding protrusions in the other side of the plates, in the area below the first block.

A second block is slideably mounted between the side plates below the first block, and is also movable in the vertical direction. This second block is somewhat narrower than the first block but has protruding shoulders at the top of the sides facing the side plates, these shoulders having a width sufficient to meet the side plates in the areas above the protrusions.

The tool also possesses a first shaft, moveably mounted in the top of the bracket in a vertical orientation. The lower portion of this shaft is adapted to mate with the first block, and the upper portion of this shaft has a handle attached to it to facilitate moving of the shaft to adjust the first block up or down. This first shaft additionally possesses a longitudinal hollow bore throughout.

A spring-loaded upwardly-biased second shaft extends through the hollow bor of the first shaft and is attached at its lower end to the second block and at its upper end to a plunger knob.

In operation, movement of the first shaft causes a raising and lowering of the first and second blocks and the associated side plates. Depression of the plunger knob causes downward movement of the spring-loaded second shaft, which in turn causes the second block to be lowered relative to the first block. In the process, the shoulders of the second block are brought into contact with the protrusions in the side plates, forcing the side plates and the bracket legs to be spread apart. Releasing the depressed plunger allows the second block to be retracted by the spring-loaded second shaft, which in turn allows the side plates and bracket legs to return to their original positions.

DESCRIPTION OF THE DRAWING

The invention will be more fully understood from a consideration of the detailed description taken in conjunction with the drawing, in which.

DETAILED DESCRIPTION OF THE INVENTION

Figure 1:
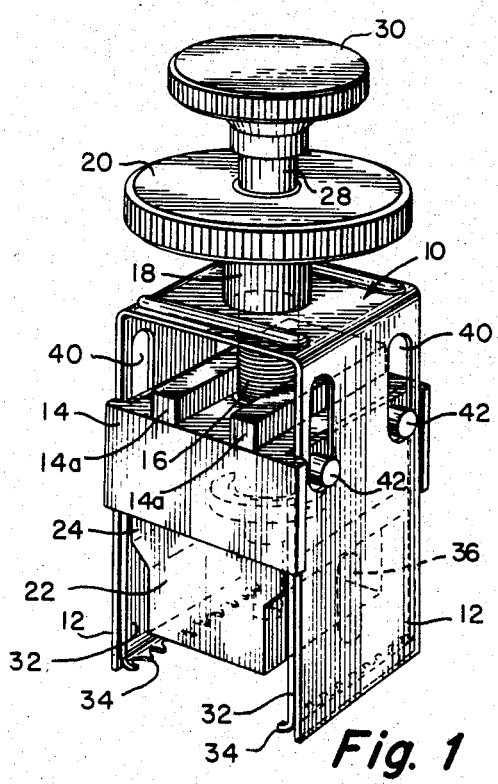
FIG. 1 is a perspective view of the tool of the invention with the plunger in a raised position.
Figure 1A:
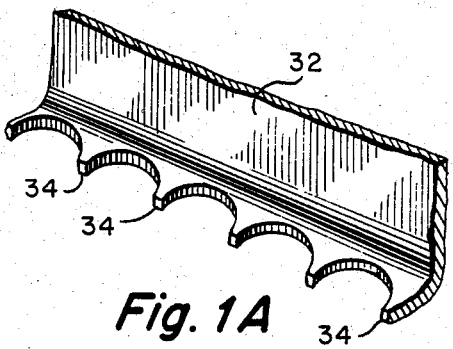
FIG. 1a is a perspective view of the cuspate-shaped grasping tines of the tool of the invention.
Figure 2:
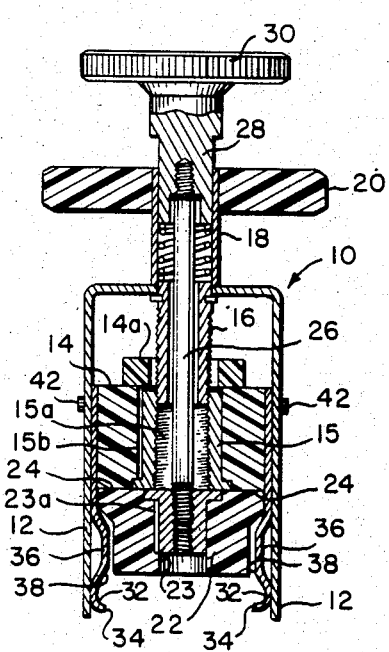
FIG. 2 is a cross-sectional view of the tool of the invention, corresponding to FIG. 1.

Referring now to the drawing, FIG. 1 shows a perspective view of the tool of the invention with the operative mechanism in a raised position. The tool is framed by an inverted generally U-shaped bracket 10 having legs 12 which support the tool in an upright orientation on a circuit board. That part of U-shaped bracket 10 which is between bracket legs 12 is the top portion of bracket 10. Slideably mounted between legs 12 is a vertical adjustment block 14 which possesses a spacer 14a on its top surface and also has a vertical threaded insert 15 defining a threaded vertical bore 15a as shown in FIG. 2. Threaded insert 15 is prevented from rotating in block 14 by protrusions such as one or more knurls or splines 15b on its outer surface which mate with corresponding channels in block 14. Into bore 15a is screwed the lower end of threaded shaft 16. Shaft 16 is an extension of shaft 18, which is attached to adjustment wheel 20. Shafts 16 and 18 are actually different parts of the same shaft, which possesses a hollow bore and is rotatably and vertically mounted in the top of bracket 10. In the illustrated embodiment, shaft 16 passes through an appropriately-sized hole in the top of bracket 10 as shown in FIG. 2, which shaft 18 cannot traverse because of its larger diameter.

Below vertical adjustment block 14 is a vertically-moveable push block 22, which is narrower than vertical adjustment block 14 but which has protruding shoulders 24 at the top of the sides of the block facing the bracket legs. Push block 22 possesses a threaded insert 23 which is prevented from rotating in block 22 by one or more knurls or splines 23a on its outer surface, which mate with corresponding channels in block 22. Block 22 is attached at insert 23 to the lower end of shaft 26, shown in FIGS. 2 and 3, which extends through the central bore in shafts 16 and 18 and is ultimately attached to plunger shaft 28 which in turn carries plunger 30. Plunger shaft 28 is sized to fit the central bore of shaft 18 as shown in FIG. 2, and is spring-loaded to hold block 22 against block 14 unless plunger 30 is depressed.

Attached to vertical adjustment block 14 between block 14 and bracket legs 12 are side plates 32 which are slideable with block 14 along the inner surfaces of bracket legs 12. Each of the side plates 32 has several spaced tines 34 at or attached to its lower end. Tines 34 are cuspate-shaped for strength, as shown in FIGS. 1, 1a, 3, 6a, and 6b. Each side plate 32 also has at least one indentation 36 on the side facing bracket leg 12. These indentations 36 create corresponding protrusions 38 in the plates 32 below the first block 14, and they are located such that when plunger 30 in not depressed, protrusions 38 are not in contact with the shoulders 24 of push block 22, but when plunger 30 is depressed, shoulders 24 of push block 22 contact side plate indentations 36 on their protruding sides 38, forcing side plates 32 and bracket legs 12 apart. Shoulders 24 of push block 22 are wide enough to meet side plates 32 in the areas above the protrusions. In an alternative embodiment, illustrated in FIGS. 7a and 7b, side plates 32 are connected by one or more springs 60 which draw the side plates together to ensure that grasped electrical components are firmly held. Springs 60 are located in recessed channels in push block 22, these channels being deep enough so that the springs do not interfere with the vertical movement of push block 22 during operation of the tool.

Figure 6A:
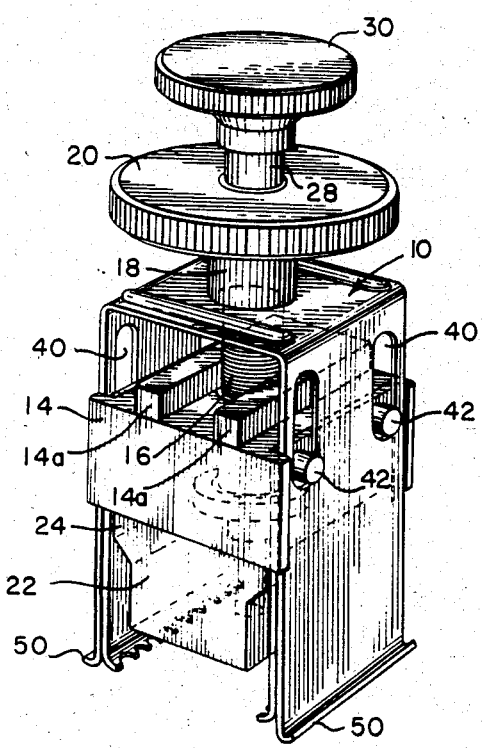
FIGS. 6a and 6b show alternative embodiments of the tool in which the legs are provided with relatively broad bases.
Figure 6B:
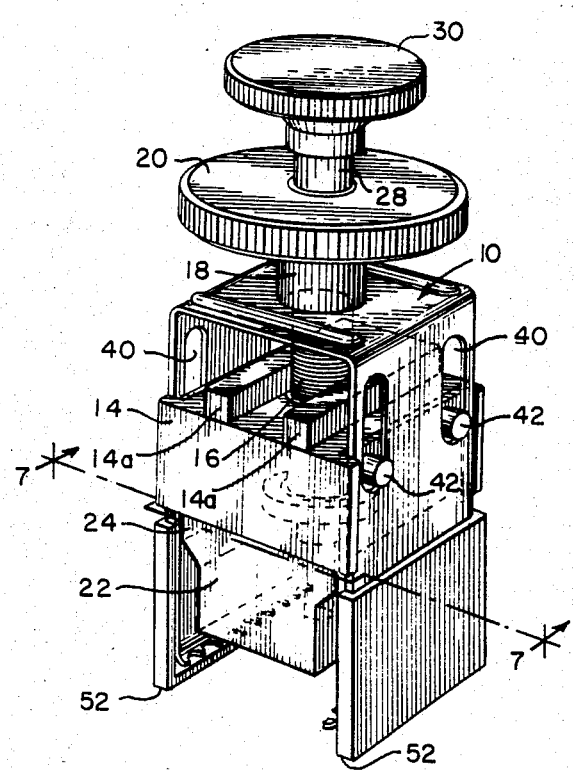
Figure 7A:
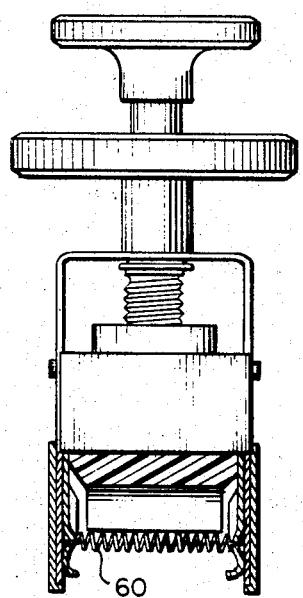
FIGS. 7a and 7b show a further alternative embodiment in which the side plates are held together by springs.
Figure 7B:
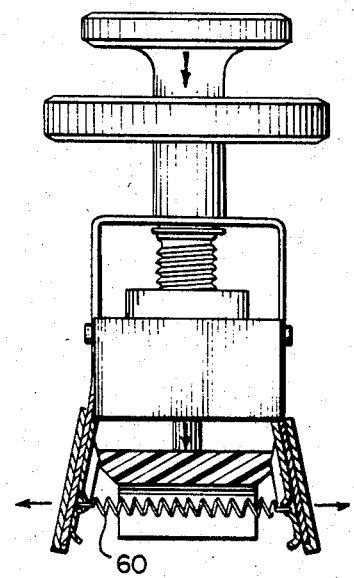

Each of the bracket legs 12 possesses at least one vertically-oriented elongated hole 40 adjacent to block 14 and block 14 also is provided with protruding pins 42 extending through holes 40 to guide block 14. The ends of bracket legs 12 may be straight, or may possess feet with surface areas larger than the cross-sectional area of the bracket legs, to enlarge the load-bearing surface area and thereby protect the circuit board surface. The ends of bracket legs 12 may be bent out to form feet 50 as shown in FIG. 6a, or may be fitted with plastic feet 52 as shown in FIG. 6b, for example.

Figure 3:
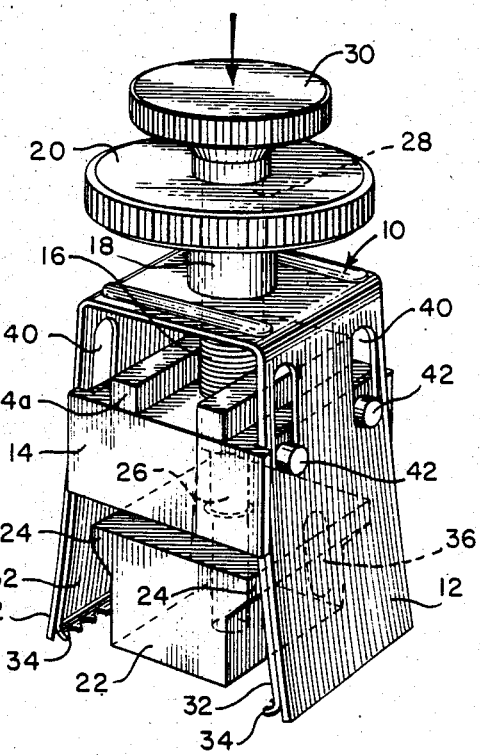
FIG. 3 is a perspective view of the tool of the invention showing the effect of depressing the plunger.

In operation, rotation of adjustment wheel 20 raises or lowers the combination of vertical adjustment block 14, push block 22, and side plates 32 relative to the ends of bracket legs 12. Spacer 14a prevents block 14 from being raised too far and bending bracket 10. Depressing plunger 30 forces push block 22 away from vertical adjustment block 14 and brings shoulders 24 of push block 22 into contact with protrusions 38 of side plates 32, causing side plates 32 and bracket legs 12 to spread apart, as shown in FIG. 3. Releasing plunger 30 allows bracket legs 12 and side plates 32 to spring together again as push block 22 rises and shoulders 24 are removed from contact with side plates protrusions 38.

Figure 4A:
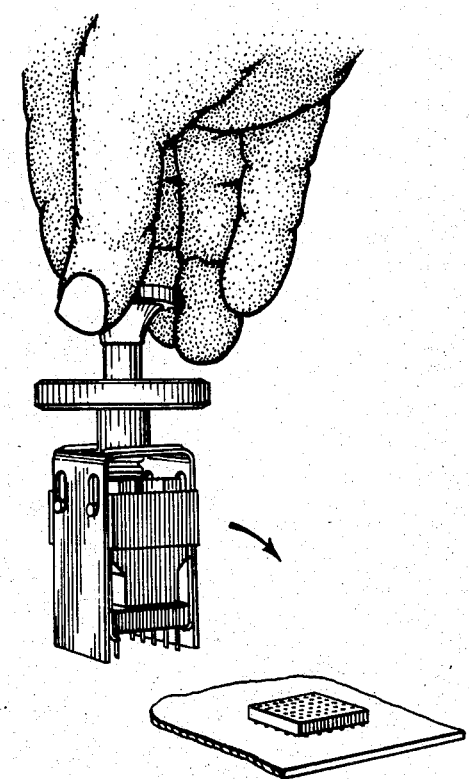
FIGS. 4a and 4b show the tool in the process of inserting an integrated circuit into a pin pack socket on a circuit board.
Figure 4B:
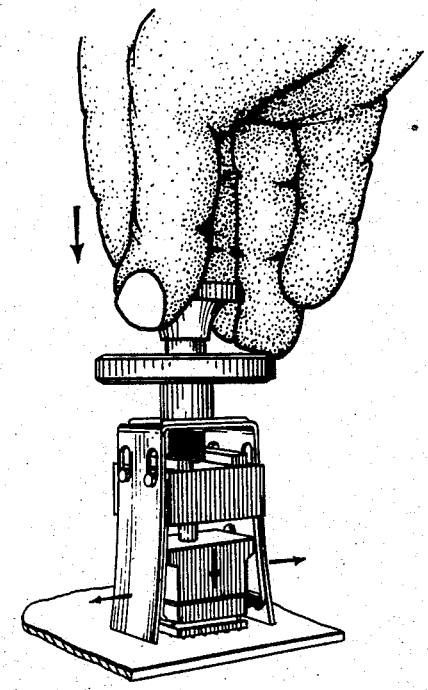

To insert an integrated circuit into an appropriate socket, plunger 30 is depressed to spread legs 12 and side plates 32, the integrated circuit is placed between side plates 32 with its pins facing downward, then plunger 30 is released to permit side plates 32 and legs 12 to spring together again, fingers 34 going between the pins of the integrated circuit, and under the body of the integrated circuit, grasping it, as shown in FIG. 4a. The tool is positioned over the holes or socket on the circuit board into which the integrated circuit is to be inserted, adjustment wheel 20 is turned to raise or lower the integrated circuit as may be necessary to position the pins of the integrated circuit over the corresponding holes or sockets, with the ends of bracket legs 12 resting on the surface of the circuit board. Plunger 30 is then depressed, causing push block 22 to spread side plates 32 and bracket legs 12, releasing the integrated circuit, and simultaneously pushing the integrated circuit down gently and evenly, causing all the integrated circuit pins to be inserted into the appropriate sockets without bending or breaking, as shown in FIG. 4b.

Figure 5A:
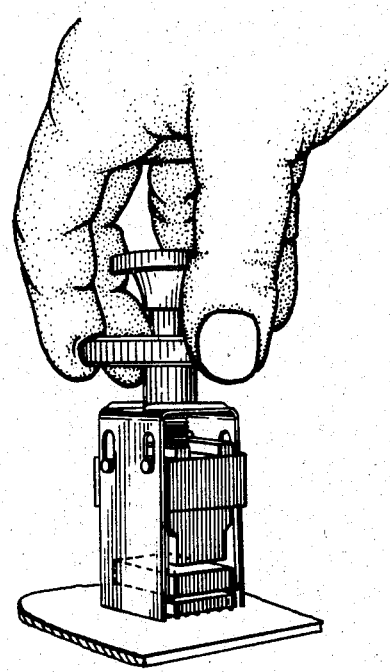
FIGS. 5a and 5b show the tool extracting an integrated circuit from a pin pack socket on a circuit board.
Figure 5B:
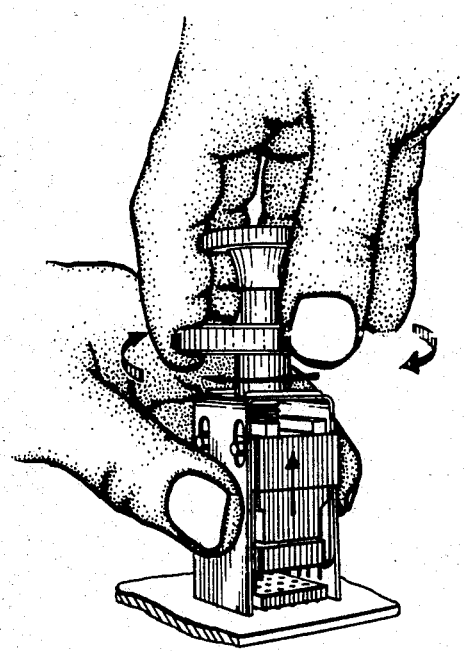

To withdraw an integrated circuit from a circuit board, adjustment wheel 20 is rotated to position side plate fingers 34 at a level slightly lower than the bottom of the integrated circuit to be removed, when the ends of bracket legs 12 rest on the surface of the circuit board. Plunger 30 is depressed to spread side plates 32 and bracket legs 12, the tool is placed over the integrated circuit to be removed, and plunger 30 is then released to allow bracket legs 12 and side plates 32 to spring together, side plate fingers 34 being inserted between the integrated circuit pins and under the integrated circuit, as shown in FIG. 5a. Adjustment wheel 20 is then rotated as shown in FIG. 5b to raise the combination of vertical adjustment block 14, push block 22, side plates 32, and the integrated circuit.

The tool may be dimensioned to accommodate integrated circuits of various sizes. It is, however, necessary to make bracket legs 12 long enough, and the range of vertical movement of adjustment block 14 wide enough, to permit insertion and removal of integrated circuits from the circuit board or from sockets on a circuit board. In addition, the minimum throw of the push block 22 must be sufficient to permit insertion of integrated circuits of all usual pin lengths. A preferred tool has a push block throw typically of seven millimeters, and a minimum range of movement of the vertical adjustment block 14 of about ten millimeters. Other dimensions may, however, be employed to suit the intended usage.

Although the invention has been disclosed and exemplified in terms of a particular embodiment, those skilled in the art will recognize that it may be employed for other sorts of multi-pin electrical components, and that various modifications may be made without departing from the intended scope of the invention. Accordingly, the invention is not to be limited except by the terms of the appended claims.

What is claimed is:

1. A tool for inserting and extracting an electronic component respectively into and from a circuit board, comprising:
    a bracket having an inverted U shape, the sides constituting bracket legs which support the tool upon a circuit board, and the part connecting said bracket legs constituting the top of said bracket;
    a first block, possessing a top surface, and being slideably mounted between said bracket legs, adjustable in the vertical direction, and adapted for attachment to a shaft for positioning said block vertically;

side plates having upper and lower ends, each side plate being attached at its upper end to said first block between said first block and said bracket legs, and terminating at its lower end in a plurality of spaced tines pointing away from the adjacent bracket leg and toward the opposing side plate, each of said side plates having at least one indentation in the side facing the adjacent bracket leg, creating a corresponding protrusion in said side plate below said first block;

a second block, slideably mounted between said side plates below said first block and movable in the vertical direction, said second block having protruding shoulders with a width sufficient to meet said side plates in the areas above said protrusions in said side plates;

a first shaft, having upper and lower portions and a hollow bore, said first shaft being moveably and vertically mounted in the top of said bracket, the lower portion of said first shaft being adapted for mating with said first block, the combination of said first shaft and said first block permitting vertical adjustment of said first block relative to said bracket;

a second shaft having upper and lower ends, said second shaft extending though said hollow bore of said first shaft and being biased upward relative to said first shaft, and attached at its lower end to said second block and at its upper end to a plunger knob;

said tool thus being constituted such that movement of said first shaft raises and lowers said first and second blocks and said associated side plates, depression of said plunger knob depresses said second shaft, which causes said second block to be depressed relative to said first block so that the shoulders of said second block contact said protrusions in said side plates, forcing said side plates and said bracket legs to spread, and the release of a depressed plunger knob causes said second block to retract and said side plates and bracket legs to return to their original positions;

said tool being operative to insert an electrical component into a circuit board by first grasping said electrical component between said side plates, and then releasing said component while simultaneously pushing it into place as said second block is forced down in response to depression of said second shaft;

said tool being operative to extract an electronic component from a circuit board by grasping said electronic component between said side plates and raising said first block, said side plates, and said component in response to movement of said first shaft.

2. The tool of claim 1 wherein said first block further comprises a spacer on its top surface.

3. The tool of claim 1 wherein said first block further comprises a threaded vertical bore, and said first shaft is threaded at its lower end to mate with said threaded vertical bore of said first block.

4. The tool of claim 3 wherein said threaded vertical bore further comprises a first vertical insert fitted into said first block, said first insert having an axially oriented threaded central bore and having an outer surface possessing at least one protrusion, to prevent rotation of said insert in said first block.

5. The tool of claim 1 wherein said second block further comprises a second vertical insert fitted into said second block, said second insert having an axially oriented threaded central bore and having an outer surface possessing at least one protrusion, to prevent rotation of said insert in said second block.

6. The tool of claim 1 wherein each of said bracket legs possesses at least one vertically oriented elongated hole located adjacent said first block, and said first block further comprises at least one protruding pin which extends through said elongated hole, to guide said first block.

7. The tool of claim 6 wherein each of said bracket legs terminates in a foot having a load-bearing surface area larger than the cross-sectional area of said bracket legs.

8. The tool of claim 1 wherein said second block has at least one channel in its bottom surface oriented perpendicular to said side plates, and said side plates are connected by at least one spring which is located in said channel.

9. A tool for inserting and extracting an integrated circuit respectively into and from a circuit board, comprising:

a bracket having an inverted U shape, the sides constituting bracket legs which support the tool upon a circuit board, and the part connecting said bracket legs constituting the top of said bracket;

a first block, possessing a top surface, and being slideably mounted between said bracket legs, adjustable in the vertical direction, and having a threaded vertical bore;

side plates, having upper and lower ends, each being attached at its upper end to said first block between said first block and said bracket legs, and terminating at its lower end in a plurality of spaced tines pointing away from the adjacent bracket leg and toward the opposing side plate, each of said side plates having at least one indentation in the side facing the adjacent bracket leg, creating a corresponding protrusion in the side plate below said first block;

a second block, slideably mounted between said side plates below said first block and movable in the vertical direction, said second block having protruding shoulders with a width surficient to meet said side plates in the areas above said protrusions in said side plates;

a first shaft, having upper and lower portions and a hollow bore, said first shaft being rotatably and vertically mounted in the top of said bracket, the lower portion of said first shaft being appropriately sized and threaded to mate with said threaded vertical bore in said first block, the upper portion of said first shaft being attached to a handle for turning of the shaft;

a spring-loaded second shaft having upper and lower ends, said second shaft extending through said hollow bore of said first shaft and being attached at its lower end to said second block and at its upper end to a plunger knob;

said tool thus being constituted such that rotation of said first shaft raises and lowers said first and second blocks and said associated side plates, depression of said plunger knob causes said second block to be depressed relative to said first block so that the shoulders of said second block contact said protrusions in said side plates, forcing said side plates and said bracket legs to spread, and the release of a depressed plunger knob allows said second block to retract and said side plates and bracket legs to return to their original positions;

said tool being operative to insert an electrical component into a circuit board by first grasping said electrical component between said side plates, and then releasing said component while simultaneously pushing it into place as said second block is forced down in response to depression of said second shaft;

said tool being operative to extract an electronic component from a circuit board by grasping said electronic component between said side plates and raising said first block, said side plates, and said component in response to rotation of said first shaft.

10. The tool of claim 9 wherein said first block further comprises a spacer on its top surface.

11. The tool of claim 9 wherein said threaded vertical bore further comprises a first vertical insert fitted into said first block, said first insert having an axially oriented threaded central bore and having an outer surface possessing at least one protrusion, to prevent rotation of said insert in said first block.

12. The tool of claim 9 wherein said second block further comprises a second vertical insert fitted into said second block, said second insert having an axially oriented threaded central bore and having an outer surface possessing at least one protrusion, to prevent rotation of said insert in said second block.

13. The tool of claim 9 wherein each of said bracket legs possesses at least one vertically oriented elongated hole located adjacent said first block, and said first block further comprises at least one protruding pin which extends through said elongated hole, to guide said first block.

14. The tool of claim 9 wherein each of said bracket legs terminates in a foot having a load-bearing surface area larger than the cross-sectional area of said bracket legs.

15. The tool of claim 9 wherein said second block has at least one channel in its bottom surface oriented perpendicular to said side plates, and said side plates are connected by at least one spring which is located in said channel.

* * * * *